(12) United States Patent
Choi et al.

(10) Patent No.: US 7,092,312 B2
(45) Date of Patent: Aug. 15, 2006

(54) PRE-EMPHASIS FOR STROBE SIGNALS IN MEMORY DEVICE

(75) Inventors: Joo S Choi, Boise, ID (US); Yogesh Sharma, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/910,049

(22) Filed: Aug. 3, 2004

(65) Prior Publication Data

US 2006/0034134 A1 Feb. 16, 2006

(51) Int. Cl.
*G11C 8/00* (2006.01)

(52) U.S. Cl. .................. 365/233; 365/193; 365/191

(58) Field of Classification Search ............... 365/233, 365/193, 191, 189.03, 189.07, 185.26
See application file for complete search history.

(56) References Cited

U.S. PATENT DOCUMENTS

| | | | |
|---|---|---|---|
| 6,272,070 B1 | 8/2001 | Keeth et al. | |
| 6,393,062 B1 | 5/2002 | Furman et al. | |
| 6,445,643 B1 | 9/2002 | Keeth et al. | |
| 6,452,938 B1 | 9/2002 | Fawal et al. | |
| 6,456,544 B1 * | 9/2002 | Zumkehr | 365/193 |
| 6,466,626 B1 | 10/2002 | Cecchi et al. | |
| 6,483,579 B1 * | 11/2002 | Koshikawa | 356/233 |
| 6,570,406 B1 | 5/2003 | Tang et al. | |
| 6,697,297 B1 | 2/2004 | Keeth et al. | |
| 6,704,818 B1 | 3/2004 | Martin et al. | |
| 6,711,597 B1 | 3/2004 | O'Donnell | |
| 6,759,868 B1 | 7/2004 | Helt et al. | |
| 6,794,900 B1 | 9/2004 | Tang et al. | |
| 6,807,114 B1 | 10/2004 | Keeth et al. | |
| 6,819,599 B1 | 11/2004 | Schaefer | |
| 2003/0212843 A1 * | 11/2003 | Molgaard et al. | 710/100 |
| 2004/0013182 A1 | 1/2004 | Tonietto | |
| 2004/0124891 A1 | 7/2004 | De Laurentiis et al. | |
| 2004/0131058 A1 | 7/2004 | Ghiasi | |
| 2005/0141330 A1 * | 6/2005 | Shin | 365/233 |
| 2005/0190635 A1 * | 9/2005 | Hargan | 365/232 |

* cited by examiner

*Primary Examiner*—Richard Elms
*Assistant Examiner*—Dang Nguyen
(74) *Attorney, Agent, or Firm*—Schwegman, Lundberg, Woessner & Kluth, P.A.

(57) ABSTRACT

A memory device has a number of data terminals for transferring data signals and a number of strobe terminals for transferring strobe signals representing timing information of the data. The strobe terminals have a fixed signal level in an inactive mode of the memory device. The memory further includes a controller for reducing any signal instability of the strobe signals when the memory device switches from the inactive mode to a data transfer mode.

42 Claims, 12 Drawing Sheets

PRE-EMPHASIS FOR STROBE SIGNALS IN MEMORY DEVICE

FIELD OF INVENTION

The present invention relates generally to semiconductor devices, more particularly, to transfer of data in memory devices.

BACKGROUND

Semiconductors devices such as memory devices reside in many computer and electronic products. Memory devices store data.

Some memory devices have data terminals for transferring data and strobe terminals for transferring strobe signals. The data is transferred based on timing derived from the strobe signals.

The data usually includes many data bits. A strobe signal typically has specified timing reference at which each of the data bits may be accurately transferred.

In some cases, the memory device may be in an inactive mode such that the signal level at the strobe terminals remains at a fixed signal level for a time period. When the memory device switches from the inactive mode to a data transfer mode, the strobe signals at the strobe terminals may switch from the fixed signal level to another signal level and may start to toggle.

In some cases, switching the strobe signals from one signal level in one mode to another signal level in another mode may introduce instability to the strobe signals at the time of switching. As a result, the timing relationship between the strobe signals and the data signals may be inaccurate and invalid data may occur.

SUMMARY OF THE INVENTION

The present invention provides circuits and methods for improving the accuracy of the transfer of data in a memory device.

One aspect includes a memory device having a memory array, a plurality of data terminals, a plurality of strobe terminals, a data transceiver circuit for transferring data signals, and a number of strobe output circuits. Each of the strobe output circuits includes a pair of parallel drivers coupled to a corresponding strobe terminal for outputting a number of strobe signals representing timing information of a number of data signals at the data terminals. The memory device further includes a pre-emphasis controller for influencing signal levels of the strobe signals to reduce any instability at the strobe signals when the strobe signals switch between different signal levels.

Another aspect includes a method of transferring data in a memory device. The method transfers a number of data bits to a number of data terminals and a number of strobe bits to a number of strobe terminals. The method initiates a pre-emphasis function to modify signal levels of strobe bits when the signal levels of the strobe bits are unequal to a termination level existed at the strobe terminals during an inactive mode. The method terminates the pre-emphasis function after the signal levels of the strobe bits are modified.

Other aspects of the present invention will be apparent upon reading the present application including the drawings and claims.

DETAILED DESCRIPTION OF THE EMBODIMENTS

Figure 1:
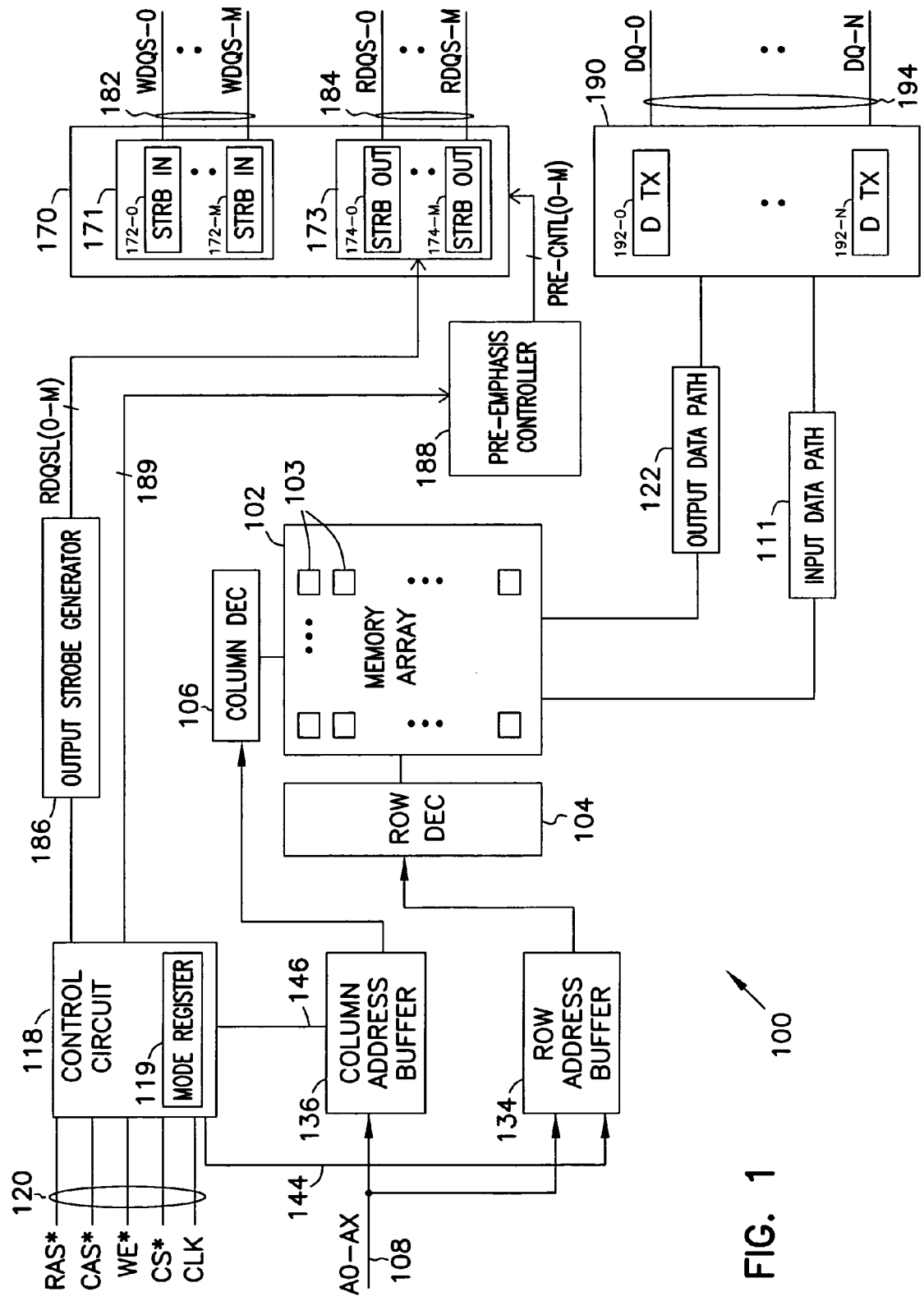
FIG. 1 shows a memory device according to embodiments of the invention.

The following description and the drawings illustrate specific embodiments of the invention sufficiently to enable those skilled in the art to practice the invention. Other embodiments may incorporate structural, logical, electrical, process, and other changes. In the drawings, like numerals describe substantially similar components throughout the several views. Examples merely typify possible variations. Portions and features of some embodiments may be included in or substituted for those of others. The scope of the invention encompasses the claims and all available equivalents.

FIG. 1 shows a memory device according to an embodiment of the invention. Memory device 100 may be a dynamic random access memory (DRAM) device, a static random access memory (SRAM) device, or a flash memory device. Examples of DRAM devices include synchronous DRAM (SDRAM), synchronous graphics random access memory(SGRAM), various generations of double data rate SDRAM (DDR SDRAM), various generations of Graphic Double Data Rate DRAM (GDDR), and Rambus DRAM devices. In FIG. 1, some elements of memory device 100 are omitted for clarity.

Memory device 100 includes a memory array 102 having a plurality of memory cells 103 for storing data. Memory cells 103 are arranged in rows and columns.

Row decoder 104 and column decoder 106 access memory cells 103 in response to address signals A0 through AX (A0–AX) provided on address lines 108.

A row address buffer 134 transfers row addresses on lines 108 to row decoder 104 based on a signal on line 144. A column address buffer 136 transfers column addresses on lines 108 to column decoder 106 based on a signal on line 146.

A control circuit 1 18 controls the operations of memory device 100 in response to control signals on control lines 120. Examples of the control signals on lines 120 include a Row Access Strobe signal RAS*, a Column Access Strobe CAS* signal, a Write Enable signal WE*, a Chip Select signal CS*, and a Clock signal CLK. Examples of the operations of memory device 100 include a read operation and a write operation. Control circuit 118 issues a READ command in the read operation and a WRITE command in the write operation.

The write operation writes input data from data lines or data terminals 194 to memory cells 103. The read operation reads output data from memory cells 103 to data lines 194. Data lines 194 are bi-directional data lines; these lines carry both of the input data provided to memory device 100 by an external source and the output data outputted from memory device 100. A combination of the address signals A0–AX on lines 108 provides the address of a row or a column of memory cells 103 being read or written.

Control circuit 118 includes a mode register 119 to store values representing the operating codes of memory device 100. Examples of the operating codes include a write latency time interval and a read latency time interval.

The write latency time interval is a time delay between the issuance of the WRITE command and the availability of a first bit of input data at data lines 194 during the write operation. In some embodiments, the time delay of the write latency time interval is the number of cycles of a clock signal such as the clock signal CLK on lines 120. For example, when mode register 119 stores a value of three (3) for the write latency time interval, the first bit of input data will be available at data lines 194 three cycles of the CLK signal after the WRITE command is issued.

The read latency time interval is a time delay between the issuance of the READ command and the availability of a first bit of output data (from memory array 102) at data lines 194 during the read operation. In some embodiments, the time delay of the read latency time interval is the number of cycles of a clock signal such as the clock signal CLK on lines 120. For example, when mode register 119 stores a value of four (4) for read latency time interval, the first bit of output data will be available at data lines 194 four cycles of the CLK signal after the READ command is issued.

Memory device 100 also includes a strobe transceiver circuit 170, a data transceiver circuit 190, an input data path 111, and an output data path 122. Data transceiver circuit 190 transfers data to and from memory device 100. Strobe transceiver circuit 170 transfers timing information of the data.

Strobe transceiver circuit 170 includes a write strobe unit 171 and a read strobe unit 173. Write strobe unit 171 has strobe input circuits (STRB IN) 172-0 through 172-M. Write strobe unit 171 transfers timing information of the input data. The write strobe signals (bits) WDQS-0 through WDQS-M on lines or strobe terminals 182 represent the timing information of the input data. An external source provides the WDQS-0 through WDQS-M signals together with the input data to memory device 100.

Read strobe unit 173 has strobe output circuits (STRB OUT) 174-0 through 174-M. Read strobe unit 173 transfers timing information of the output data. The read strobe signals RDQS-0 through RDQS-M on lines or strobe terminals 184 represent the timing information of the data outputted from memory device 100. An output strobe generator 186 generates a number of latched read strobe signals (bits) RDQSL(0–M). The RDQSL(0–M) signals present the RDQS-0 through RDQS-M signals before the RDQS-0 through RDQS-M signals are provided to strobe terminals 184.

Data transceiver circuit 190 includes data transceivers (D TX) 192-0 through 192-N. Data transceivers 192-0 through 192-N are bidirectional circuits; they transfer data in both directions. Data transceivers 192-0 through 192-N transfer both of the input data and the output data. The data (data signals or data bits) DQ-0 through DQ-N on data lines 194 represent both of the input data and the output data. DQ-0 through DQ-N represent the input data when memory device 100 receives data during the write operation. DQ-0 through DQ-N represent the output data when memory device 100 outputs data during the read operation.

In some embodiments, each of the RDQS-0 through RDQS-M signals carries timing information of one of the DQ-0 through DQ-N signals; in these embodiments, the number of the RDQS-0 through RDQS-M signals is equal to the number of the DQ-0 through DQ-N signal (M=M). In other embodiments, each of the RDQS-0 through RDQS-M signals carries timing information of a group of the DQ-0 through DQ-N signals; in these embodiments, the number of the RDQS-0 through RDQS-M signals is less than the number of the DQ-0 through DQ-N signal (M<N).

Input data path 111 transfers data between data transceiver circuit 190 and memory array 102 during the write operation. Output data path 122 transfers data between data transceiver circuit 190 and memory array 102 during the read operation.

In some embodiments, lines 108, 120, 182, 184, and 194 correspond to pins or solder balls on a packaged integrated circuit of memory device 100. In other embodiments, lines 108, 120, 182, 184, and 194 correspond to pads on a circuit die of memory device 100.

Memory device 100 further includes a pre-emphasis controller 188 for controlling a pre-emphasis function of memory device 100. Pre-emphasis controller 188 responds to signals on lines 189 from control circuit 118 to activate a number of pre-emphasis control signals PRE-CNTL(0–M). In the pre-emphasis function, read strobe unit 173 responds to the PRE-CNTL(0–M) signals to stabilize the RDQS-0 through RDQS-M signals when the RDQS-0 through RDQS-M signals switch between different signals in different modes. Read strobe unit 173 stabilizes the RDQS-0 through RDQS-M signals during the pre-emphasis function by controlling the signal levels of the RDQS-0 through RDQS-M signals.

Memory device 100 has an inactive mode such as an idling mode or a standby mode in which memory device 100 may suspend or halt activities at strobe terminals 184 for a time period. In some embodiments, memory device 100 may hold the signal levels of the RDQS-0 through RDQS-M signals at a fixed signal level (fixed value) during the inactive mode. In this specification, the fixed signal level at strobe terminals 184 during the inactive or standby mode is also referred to as the termination level. When memory device 100 exits the inactive mode and starts another mode or operation, memory device 100 may switch the RDQS-0 through RDQS-M signals from the termination level (fixed signal level) to a different signal level. In some cases, switching the RDQS-0 through RDQS-M signals from the termination level to another signal level may introduce instability to the RDQS-0 through RDQS-M signals at the time of switching.

Pre-emphasis controller 188 and read strobe output circuits STRB OUT 174-0 through 174-M are configured to reduce the instability at the RDQS-0 through RDQS-M signals when memory device 100 switches between different modes.

Figure 2:
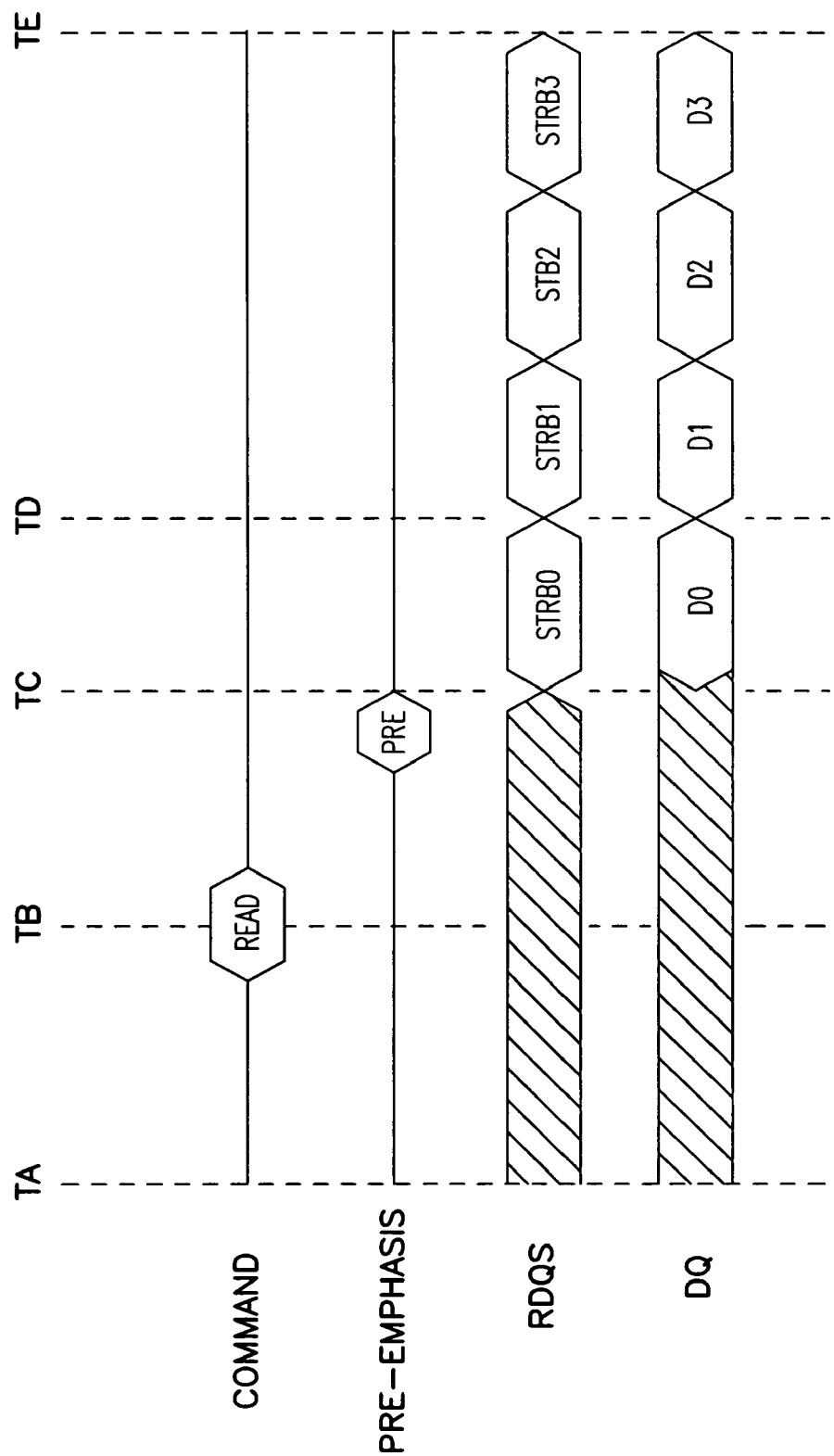
FIG. 2 is an exemplary timing diagram for FIG. 1.

FIG. 2 is an exemplary timing diagram for FIG. 1. In FIG. 2, TA, TB, TC, TD, and TE represent various times. COMMAND represents the command issued by control circuit 118 of FIG. 1. FIG. 2 shows the READ command as an example. RDQS in FIG. 2 represents timing information of one of the read strobe signals RDQS-0 through RDQS-M signals of FIG. 1. DQ in FIG. 2 represents data information of one of the data signals DQ-0 through DQ-N of FIG. 1. For simplicity, FIG. 2 shows timing information for only one read strobe signal RDQS and data information for only one data signal DQ. The read strobe signals RDQS-0 through RDQS-M and the data signals DQ-0 through DQ-N of FIG. 1 have timing information and data information similar to that of the RDQS and DQ signals shown in FIG. 2.

At time TB, the read command (READ) is issued to read or output data from memory device 100. In some embodiments, the time interval between TB and TC represents the read latency time interval. As described previously in FIG. 1, the read latency time interval is a time delay between the issuance of the READ command and the availability of a first bit of data at data lines 194 of memory device 100 of FIG. 1.

In FIG. 2, since the read latency time interval may be the time interval between times TB and TC, the first bit of the data is not available at data lines 194 until time TC, which is the end of the read latency time interval.

At some time before time TC, memory device 100 may be in an inactive mode such that the RDQS and DQ signals remain at a termination level and have meaningless timing information and meaningless data information. In some embodiments, the termination level is ground. In other embodiments, the termination level is at a supply voltage level (Vcc). In some other embodiments, the termination level is at some voltage level between ground and Vcc. FIG. 2 shows that between times TA and TC, the RDQS and DQ signals are shaded to indicate that the signal levels of the RDQS and DQ signals between times TA and TC may be at some termination level.

Between times TC and TE, the RDQS signal has timing information indicated by a number of strobe bits STRB0–STRB3 (STRB0, STRB1, STRB2, STRB0, and STRB3). The DQ signal has data information indicated by a number of data bits D0–D3 (D0, D1, D2, and D3). Each of the strobe bits STRB0–STRB3 carries timing information of a corresponding data bit. For example, the first strobe bit STRB0 between time TC and TD carries timing information of the first data bit D0.

In this specification, signal and bit (or bits) are used interchangeable to represent the same subject. For example, data signal and data bit (or data bits) are used interchangeably to represent data information. As another example, strobe signal and strobe bit (or strobe bits) are used interchangeably to represent strobe timing information.

In FIG. 2, the "PRE" represents the action of the pre-emphasis function that pre-emphasis controller 188 applies to the first strobe bit STRB0. In some embodiments, pre-emphasis controller 188 influences the signal level that represents the first bit STRB0 during the pre-emphasis function. For example, pre-emphasis controller 188 may change the slew rate of the RDQS between times TC and TD. Pre-emphasis controller 188 may also allow the signal representing the first strobe bit STRB0 (the signal level of the RDQS signal between times TC and TD) to reach a full signal swing or full rail-to-rail voltage such as a supply voltage and ground. In some embodiments, changing the slew rate of the first bit or allowing the first bit to reach a full signal swing may stabilize the RDQS signal, reduce the signal jitter of the RDQS signal, leading to more accurate transfer of data.

In some embodiments, when the first strobe bit (e.g., STRB0 in FIG. 2) has the same signal level as the termination level of the RDQS signal, pre-emphasis controller 188 may omit applying the pre-emphasis function to the first strobe bit and applies the pre-emphasis function to other strobe bits. For example, pre-emphasis controller 188 may apply the pre-emphasis function to a selected strobe bit among the strobe bits STRB1, STRB2 and STRB3 when the selected strobe bit has a signal level unequal to the termination level.

FIG. 2 shows that the first data bit D0 is outputted with the first strobe bit STRB0. In some embodiments, the latency time interval of memory device 100 may be set such that the first data bit D0 may be outputted at the second strobe bit (STRB1) or at other strobe bits (STRB2 or STRB3).

Figure 3:
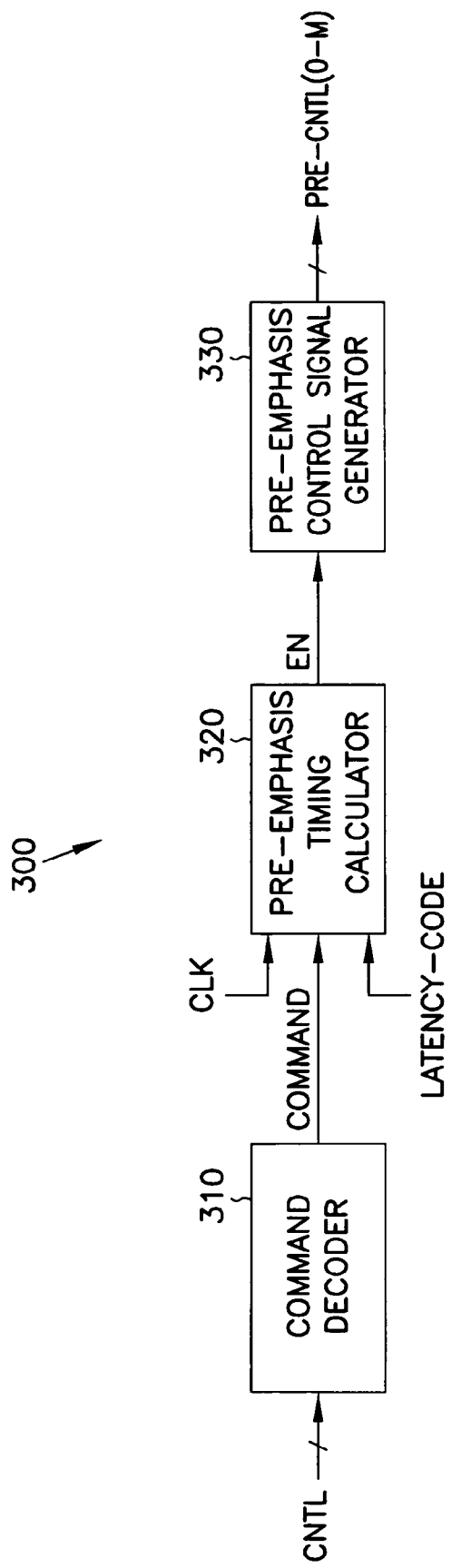
FIG. 3 shows a pre-emphasis controller according to embodiments of the invention.

FIG. 3 shows a pre-emphasis controller according to embodiments of the invention. Pre-emphasis controller 300 may be included in or substituted for pre-emphasis controller 188 of FIG. 1. In FIG. 3, pre-emphasis controller 300 includes a command decoder 310, a pre-emphasis timing calculator 320, and a pre-emphasis control signal generator 330.

Command decoder 310 responds to a number of control signals (CNTL) to generate a command signal COMMAND. In some embodiments, the control signals CNTL may be control signals such as the RAS*, CAS*, WE*, and CS* signals on lines 120 of FIG. 1. The COMMAND signal may be a read command of a memory device such as memory device 100 of FIG. 1.

In FIG. 3, pre-emphasis timing calculator 320 responds to the combination of the COMMAND signal, a latency setting code LATENCY-CODE, and a clock signal CLK to generate a timing enable signal EN. The COMMAND signal indicates an operation such as the read operation. The LATENCY-CODE indicates the value of a latency time interval such as the read latency time interval. As described in FIG. 1, the read latency time interval is a time delay between the issuance of the READ command and the availability of a first bit of output data at a data line. The time delay may be measured by the number of cycles of a clock signal such as the CLK signal in FIG. 1 and FIG. 3. The LATENCY-CODE in FIG. 3 may be provided by a register in such as mode register 119 of FIG. 1.

Pre-emphasis control signal generator 330 responds to the EN signal to generate a number of pre-emphasis control signals PRE-CNTL(0–M). The PRE-CNTL(0–M) signals may be used to control a pre-emphasis function of a memory device such as the pre-emphasis function of memory device 100 described in FIG. 1 and FIG. 2. In some embodiments, pre-emphasis controller 300 uses the PRE-CNTL(0–M) signals to control a read strobe unit during a pre-emphasis function to influence the signal levels of a number of read strobe signals such as RDQS-0 through RDQS-M signals of FIG. 1.

In some embodiments, pre-emphasis timing calculator 320 of FIG. 3 is configured to deactivate the EN signal within a time interval after the EN signal is activated. For example, pre-emphasis timing calculator 320 may be configured to deactivate the EN signal within a number of the CLK signal after the EN signal is activated. In these embodiments, in response to the deactivation of the EN signal, pre-emphasis control signal generator 330 deactivates the PRE-CNTL(0–M) signals to end the pre-emphasis function. Thus, embodiments exist where pre-emphasis control signal generator 330 may activate the PRE-CNTL(0–M) signals in a pre-emphasis function to influence a number the strobe bits that is less than the total number of the strobe bits. For example, embodiments exist where pre-emphasis control signal generator 330 may activate the PRE-CNTL(0–M)

signals in a pre-emphasis function to influence only the one strobe bit such as the first strobe bit STRB0 of FIG. 2.

As described previously, the termination level of the RDQS signal refers to the fixed signal level of the RDQS signal when a memory device such as memory device 100 in an inactive mode or a standby mode. In some embodiments, pre-emphasis controller 320 may be used in a memory device such as memory device 100, in which the first strobe bit such as strobe bit STRB0 in FIG. 2 has the same signal level as the termination level. In these embodiments, pre-emphasis controller 300 of FIG. 3 may include a register for storing a termination value corresponding to the termination level, and a comparator for comparing the termination value stored in the register with the bit value of each of the strobe bits before the strobe bits are transferred to strobe terminals 184. Based on the comparison in these embodiments, pre-emphasis controller 300 activates the PRE-CNTL(0–M) signals accordingly. For example, when the stored termination value is equal to the bit value of the strobe bit, pre-emphasis controller 300 may keep the PRE-CNTL(0–M) signals inactivated. When the stored termination value is unequal to the bit value of the strobe bit, pre-emphasis controller 300 may activate the PRE-CNTL (0–M) signals to perform the pre-emphasis function. Thus, embodiments exit where pre-emphasis controller 300 may apply the pre-emphasis function to the second strobe bit or other subsequent strobe bits.

Figure 4:
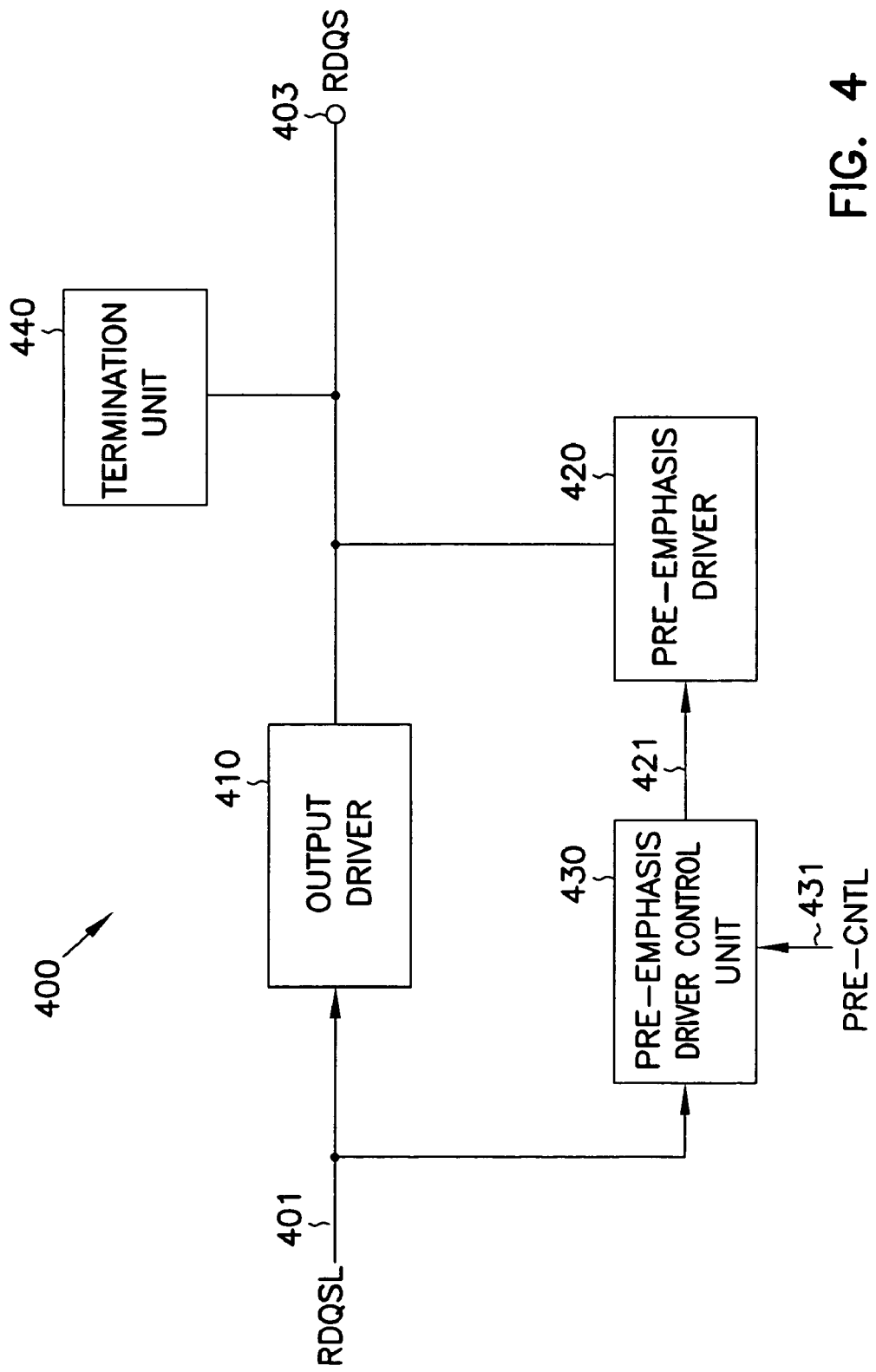
FIG. 4 shows a strobe output circuit according to embodiments of the invention.

FIG. 4 shows a strobe output circuit according to embodiments of the invention. In some embodiments, strobe output circuit 400 may be included in or substituted for one or more of the strobe output circuits (STRB OUT) 174-0 through 174-M of FIG. 1. In FIG. 4, strobe output circuit 400 includes an output driver 410, a pre-emphasis driver 420, a pre-emphasis driver control unit 430, and a termination unit 440.

Output driver 410 responds to an input signal or a latched strobe signal RDQSL at an input node 401 to drive a strobe signal RDQS at a strobe terminal 403. Pre-emphasis driver 420 responds to a signal on input node 421 to influence the RDQS signal during a pre-emphasis function. Pre-emphasis driver control unit 430 controls the signal on node 421 in response to a pre-emphasis control signal PRE-CNTL on a control node 431. Termination unit 440 applies a termination level (fixed signal level) to strobe terminal 403 when output driver 410 and pre-emphasis driver 420 are inactive or deactivated. In some embodiments, termination unit 440 includes a passive resistance device. In other embodiments, termination unit 440 includes an active resistance device.

The RDQSL, RDQS, and PRE-CNTL signals of FIG. 4 represent one of the RDQSL(0–M) signals, one of the RDQS(0–M) signals, and one of the PRE-CNTL(0–M) signals of FIG. 1, respectively.

In some embodiments, strobe output circuit 400 may be included in a device for use in a pre-emphasis function to influence a signal level of a single signal. For example, strobe output circuit 400 may be included in a memory device such as memory device 100, in which the memory device may use a pre-emphasis controller such as pre-emphasis controller 188 to influence a signal level of a single strobe signal to reduce any instability of the single strobe signal.

Figure 5:
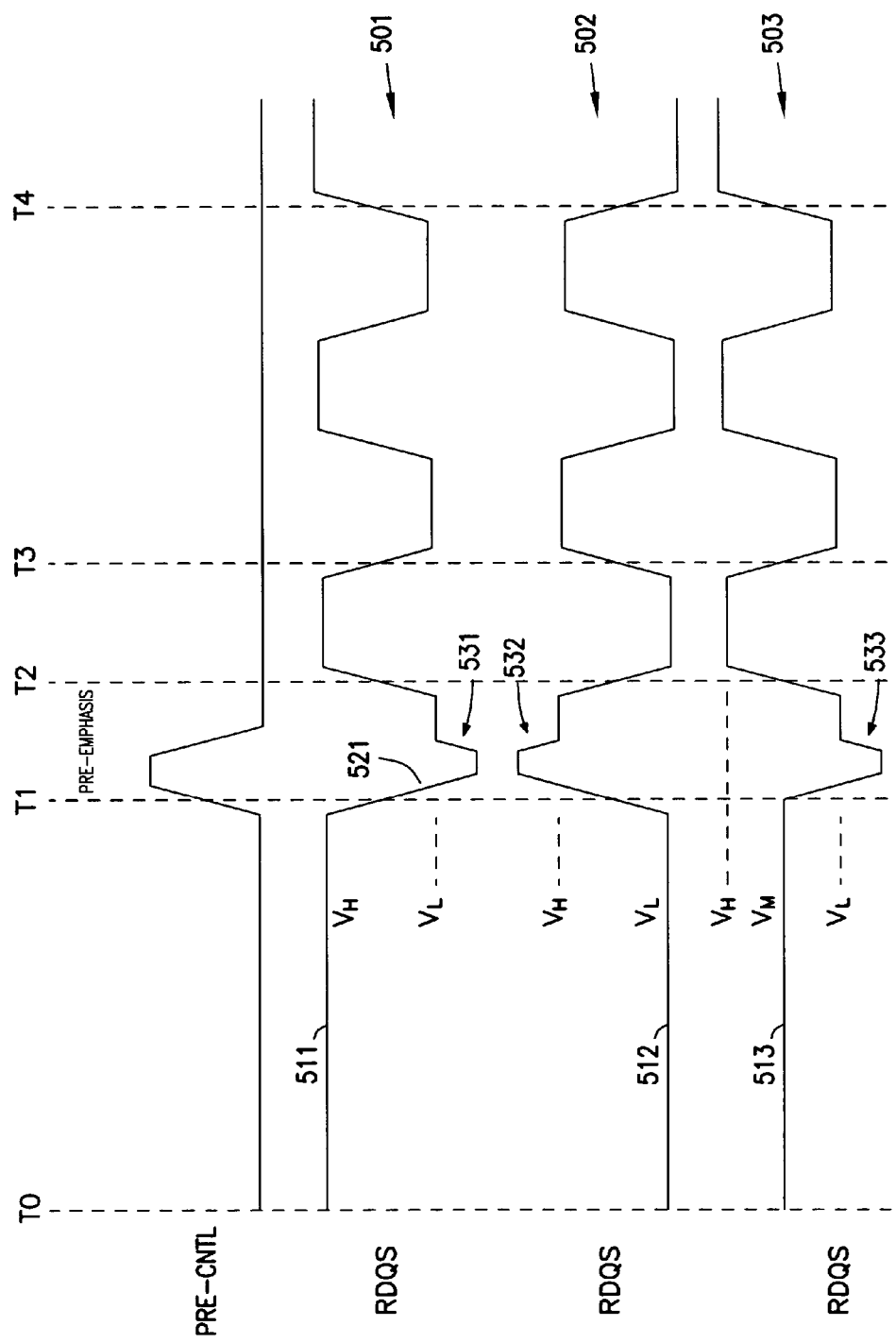
FIG. 5 is an exemplary timing diagram for FIG. 4.

FIG. 5 is an exemplary timing diagram for FIG. 4. FIG. 5 shows three separate timing portions 501, 502, and 503 to represent three different exemplary timing diagrams corresponding to three different possible configurations of strobe output circuit 400 of FIG. 4. Timing portions 501, 502, and 503 of FIG. 5 represent three possible timing for FIG. 4 when the RDSQ signal at strobe terminal 403 has termination levels at 511 ($V_H$), 512 ($V_L$), and 513 ($V_M$), respectively.

$V_H$, $V_L$, and $V_M$ represent different signal levels. In some embodiments, $V_H$ is a voltage corresponding to a first binary value (e.g., one). In some embodiments, $V_L$ is a voltage level corresponding to a second binary value (e.g., zero). $V_M$ corresponds to a voltage value between $V_H$ and $V_L$. In FIG. 5, T0, T1, T2, T3, and T4 represent various times. The signal levels of the RDQS signal between T1 and T4 represent multiple strobe bits with different bit values. For example, in timing portion 501, the signal level of the RDQS signal between times T1 and T2 may represent a first strobe bit, which has a bit value of zero value; the signal level of the RDQS signal between times T2 and T3 may represent a second strobe bit, which has a bit value of one.

The time interval between times T0 and T1 may occur in an inactive mode of a memory device such as memory device 100. Both of the output driver 410 and pre-emphasis driver 420 are inactive or deactivated between times T0 and T1. The pre-emphasis function may be performed between times T1 and T2. The time interval between time T1 and T4 may occur in a read operation of a memory device such as memory device 100.

Before time T1, the PRE-CNTL signal is deactivated (low). Between times T1 and T2, the PRE-CNTL signal is high or is activated. Since the signal level of the RDSQ signal presents the first strobe bit between time T1 and T2, the pre-emphasis function influence the signal level representing the first strobe bit. After time T2, the PRE-CNTL signal is low or is deactivated to end the pre-emphasis function.

At time T1 in FIG. 5, the RDQS signal of each of the timing portions 501, 502, and 503 begins to switch from the termination level to a different level. For example, at time T1 of timing portion 501, the RDQS signal begins to switch from signal level 511 ($V_H$) to $V_L$. In some embodiments, switching from the termination level (e.g., 511) to a different signal level may introduce instability to the RDSQ signal. The activation of the PRE-CNTL signal between times T1 and T2 may reduce any instability at the RDQS signal between times T1 and T2. For example, the pre-emphasis function between times T1 and T2 may change the slew rate of edge 511 such that edge 511 may have a higher slope or a faster slew rate in comparison to that of the RDQS signal without the pre-emphasis function. In other embodiments, the pre-emphasis function may allow the signal level of the RDQS signal to reach full signal swing between $V_H$ and $V_L$. For example, signal portions 531, 532, and 533 indicate that the signal level of the RDQS signal reach at least $V_H$ or $V_L$ during the pre-emphasis function between times T2 and T2. Thus, FIG. 5 shows that when the RDQS signal switches from a termination level to a different signal between different modes, the pre-emphasis function may reduce any instability introduced to the RDQS signal by changing the slew rate of the RDQS signal or allowing the RDQS signal to have full signal swing.

In FIG. 5, the PRE-CNTL signal is activated between times T1 and T2 to influence a signal level presenting the first strobe bit. In some embodiments, the PRE-CNTL signal may be activated at a different time interval to influence a signal level presenting a different strobe bit. For example, the PRE-CNTL signal may be activated between times T2 and T3 to influence the signal level of the RDQS signal between times T2 and T3, in which the signal level of the RDQS signal may represent the second strobe bit.

In FIG. 5, the PRE-CNTL signal is activated when it has high signal level between times T1 and T2. In some embodiments, the PRE-CNTL signal may have a low signal level when it is activated.

Figure 6:
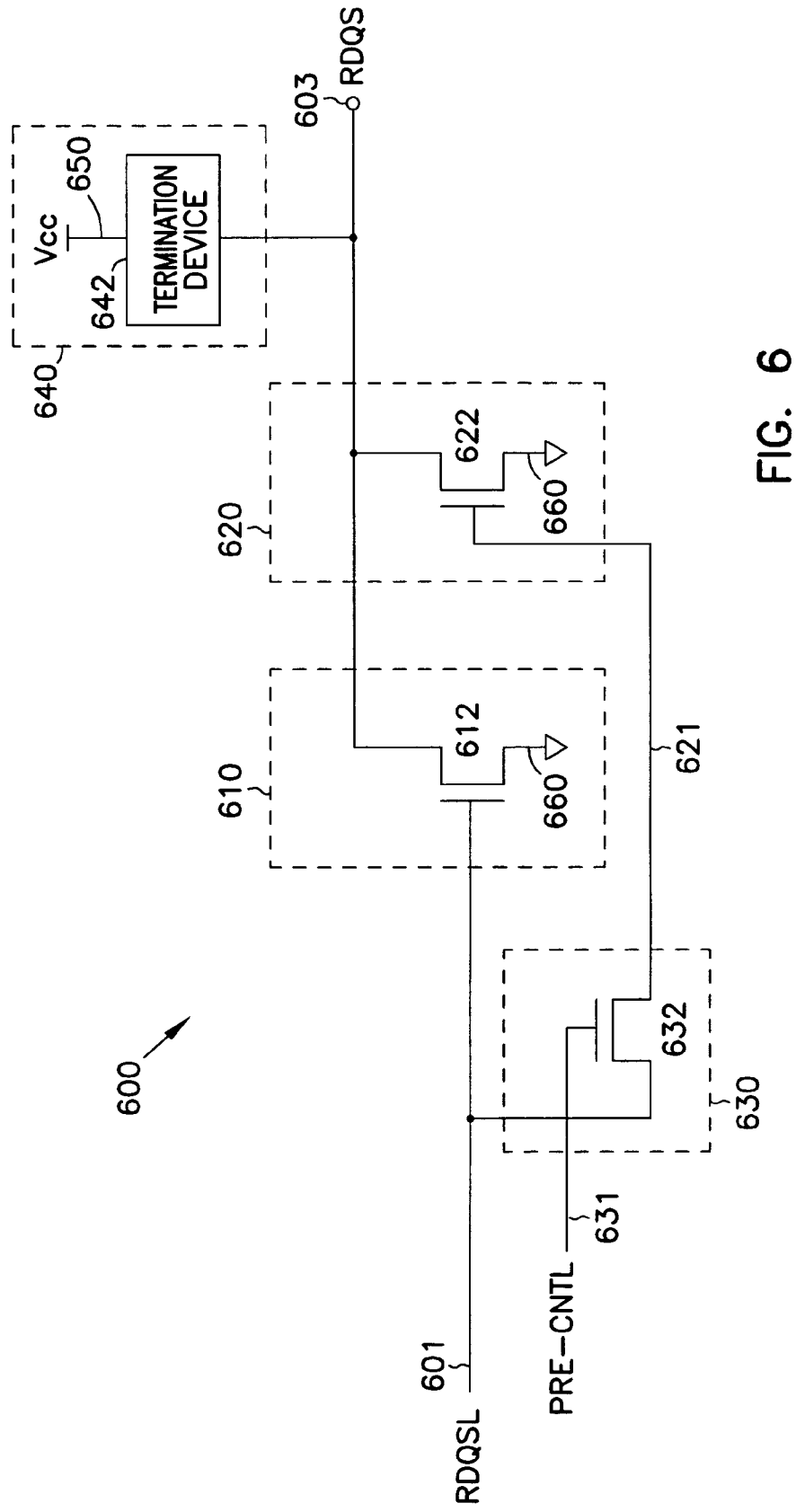
FIG. 6 shows a strobe output circuit having a termination unit connected to a first supply node according to embodiments of the invention.

FIG. 6 shows a strobe output circuit having a termination unit connected to a first supply node according to embodiments of the invention. Strobe output circuit 600 includes an output driver 610, a pre-emphasis driver 620, a pre-emphasis driver control unit 630, and a termination unit 640.

Termination unit 640 includes a termination device 642 connected between strobe terminal 603 and a supply node 650. In FIG. 6 supply node 650 connects to a supply voltage Vcc. In some embodiments, supply node 650 may connects to other voltages. Termination unit 640 applies a termination level equal to the voltage level (Vcc) at node 650 to strobe terminal 603. In some embodiments, termination unit 640 includes a passive resistance device connected between strobe terminal 603 and supply node 650. In other embodiments, termination unit 640 includes an active resistance device connected between strobe terminal 603 and supply node 650.

Output driver 610 responds to an input signal or a latched strobe signal RDQSL at an input node 601 to drive a strobe signal RDQS at a strobe terminal 603. Pre-emphasis driver 620 responds to a signal on input node 621 to influence the signal level of the RDQS signal during a pre-emphasis function. Pre-emphasis driver control unit 630 controls the signal on node 621 in response to a control signal PRE-CNTL signal on a control node 631.

Output driver 610 includes a driver transistor 612. Pre-emphasis driver 620 includes a pre-emphasis transistor 622. Transistors 612 and 622 form a pair of parallel transistors connected between strobe terminal 603 and a supply node 660. In FIG. 6, supply node 660 connects to ground. In some embodiments, supply node 660 may connects to other voltages. Pre-emphasis driver control unit 630 includes a transistor 632 connected between input nodes 601 and 621. Transistor 632 serves as a switch to control the connections between the gates of transistors 612 and 622.

Strobe output circuit 600 may be substituted for one or more of the strobe output circuit circuits (STRB OUT) 174-0 through 174-M of memory device 100 of FIG. 1. Thus, the RDQSL, RDQS, PRE-CNTL signals of FIG. 6 may represent one of the RDQSL(0–M) signals, one of the RDQS (0–M) signals, and one of the PRE-CNTL(0–M) signals of FIG. 1, respectively.

Figure 7:
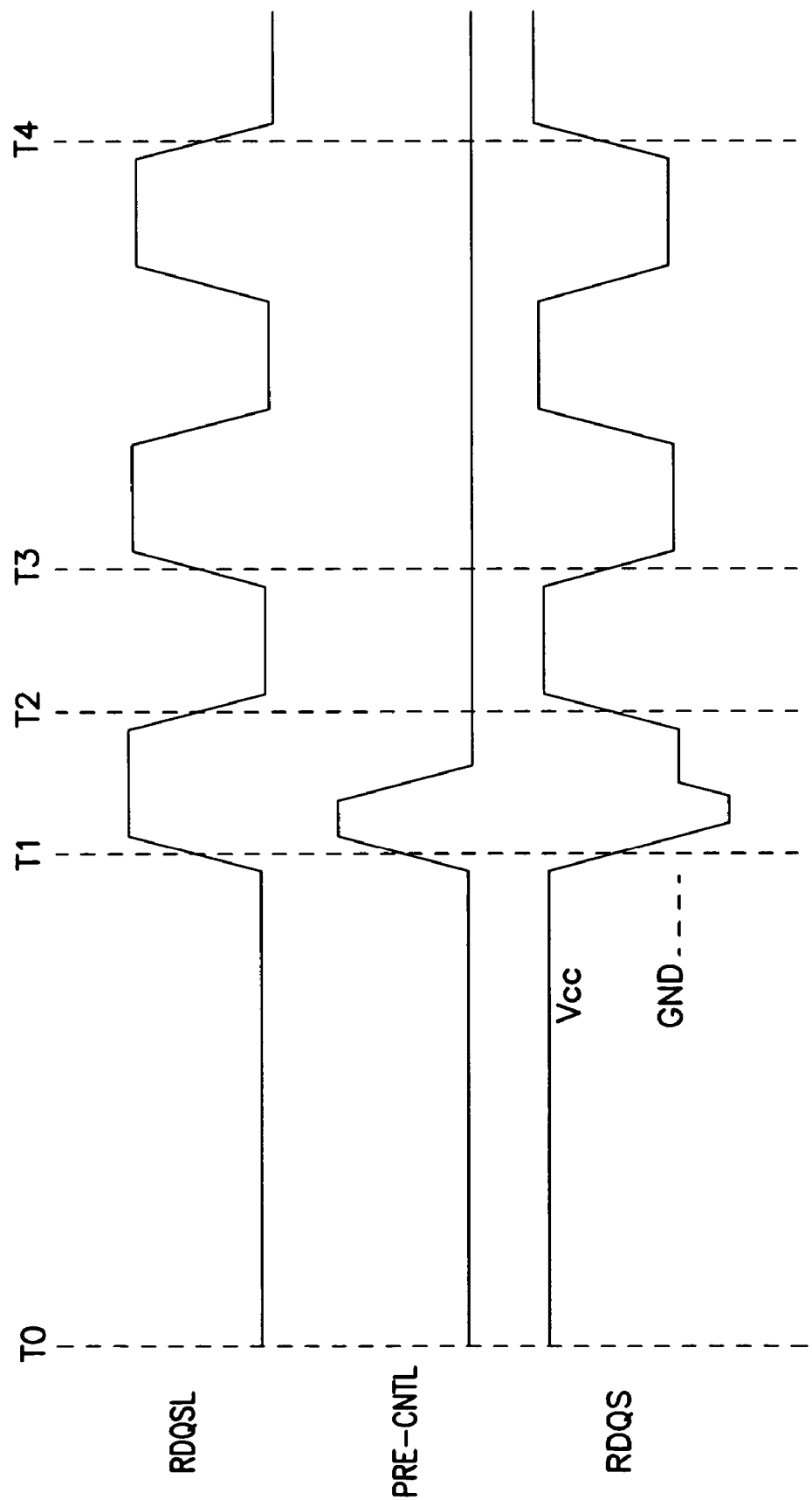
FIG. 7 is an exemplary timing diagram for FIG. 5.

FIG. 7 is an exemplary timing diagram for FIG. 6. In FIG. 6, T0, T1, T2, T3, and T4 represent various times. Between times T0 and T1, the RDQSL, PRE-CNTL, and RDQS signals are inactivated. The RDQS signal has a fixed signal level at Vcc. Between times T1 and T4, the RDQSL signal is activated and switches between high and low. In response to the RDQSL signal, transistor 612 of FIG. 1 turns on and off, causing the RDQS signal at strobe terminal 603 to switch between Vcc and ground (GND).

In FIG. 7, the PRE-CNTL signal is activated to a high signal level between times T1 and T2. When the PRE-CNTL signal is activated, transistor 632 turns on and connects the gate of transistor 622 to input node 601. The RDQSL signal at node 601 switches from low to high at time T1. Thus, at time T1, transistor 622 turns on. Since both the gates of transistors 612 and 622 connects to the same node at time T1, both transistors 612 and 622 creates multiple current paths between strobe node 603 and node 660 at time T1. Transistors 612 creates a first current path from strobe terminal 603 to supply node 600. Transistors 622 creates a second current path from strobe terminal 603 to supply node 660. Multiple current paths may change the slew rate of the RDQS signal between time T1 and T2 or may allow the signal level of the RDQS signal to reach a full voltage level of supply node 660. Thus, the RDQS may be stabilized when it switches between signal levels for the first time (at time T1) after an inactive period (e.g., the inactive period between times T0 and T1).

The PRE-CNTL signal is deactivated at time T2. Transistor 622 turns of when the PRE-CNTL signal is deactivated. In FIG. 6, a pre-emphasis function is performed between times T1 and T2. The pre-emphasis function ends when transistor 622 turns off. In some embodiments, the PRE-CNTL signal may be activated at other times to influence the signal level of the RDQS signal at times different from the times between T1 and T2.

Figure 8:
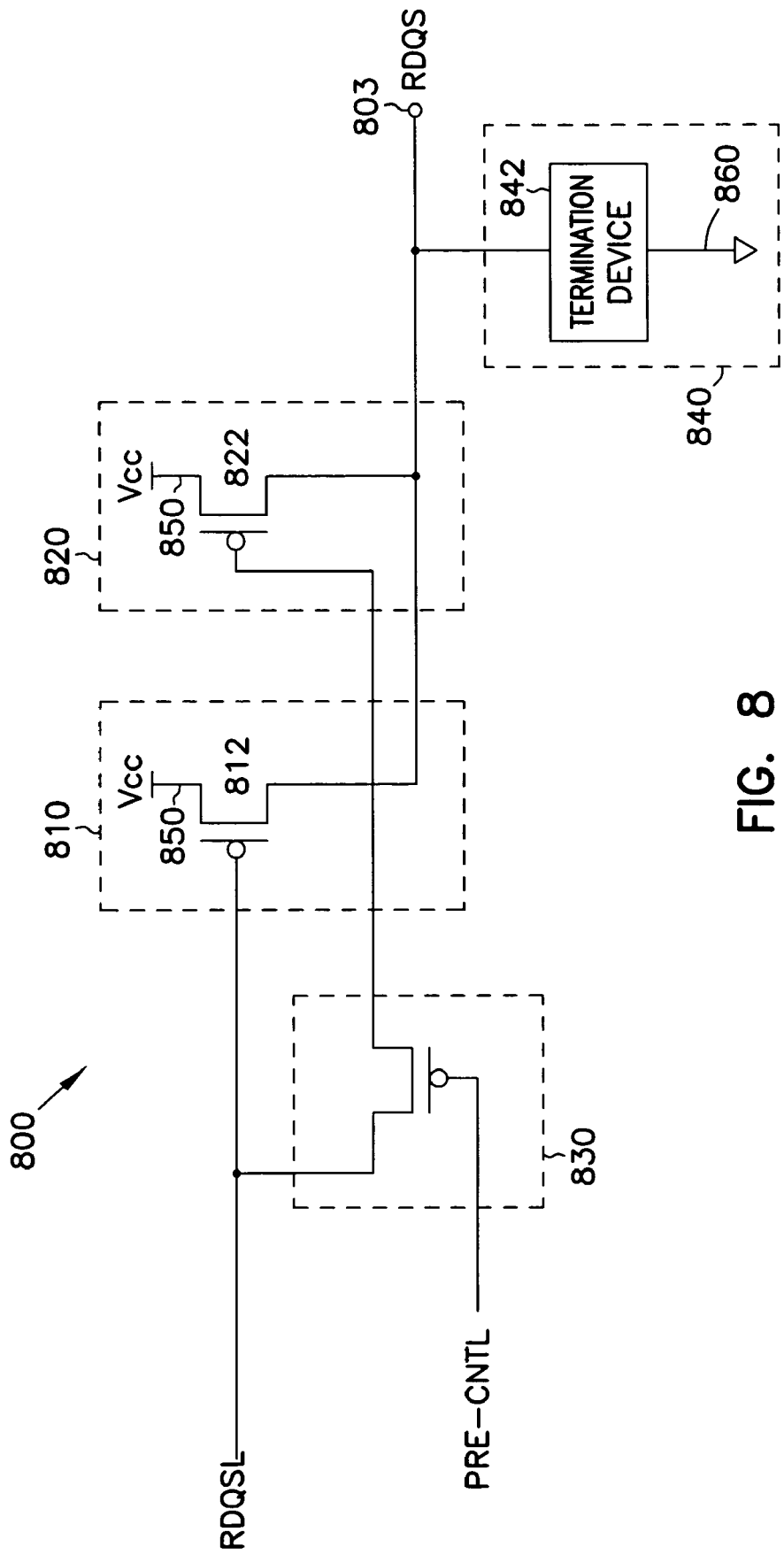
FIG. 8 shows a strobe output circuit having a termination unit connected to a second supply node according to embodiments of the invention.

FIG. 8 shows a strobe output circuit having a termination unit connected to a second supply node according to embodiments of the invention. Strobe output circuit 800 includes an output driver 810, a pre-emphasis driver 820, a pre-emphasis driver control unit 830, and a termination unit 840. Parallel transistors 812 and 822 connect between strobe terminal 803 and a supply node 850, which connects to Vcc. Termination unit 840 includes a termination device 842 connects between strobe terminal 803 and a supply node 860, which connects to ground. In some embodiments, termination unit 840 includes a passive resistance device connected between strobe terminal 803 and supply node 860. In other embodiments, termination unit 840 includes an active resistance device connected between strobe terminal 803 and supply node 860.

Figure 9:
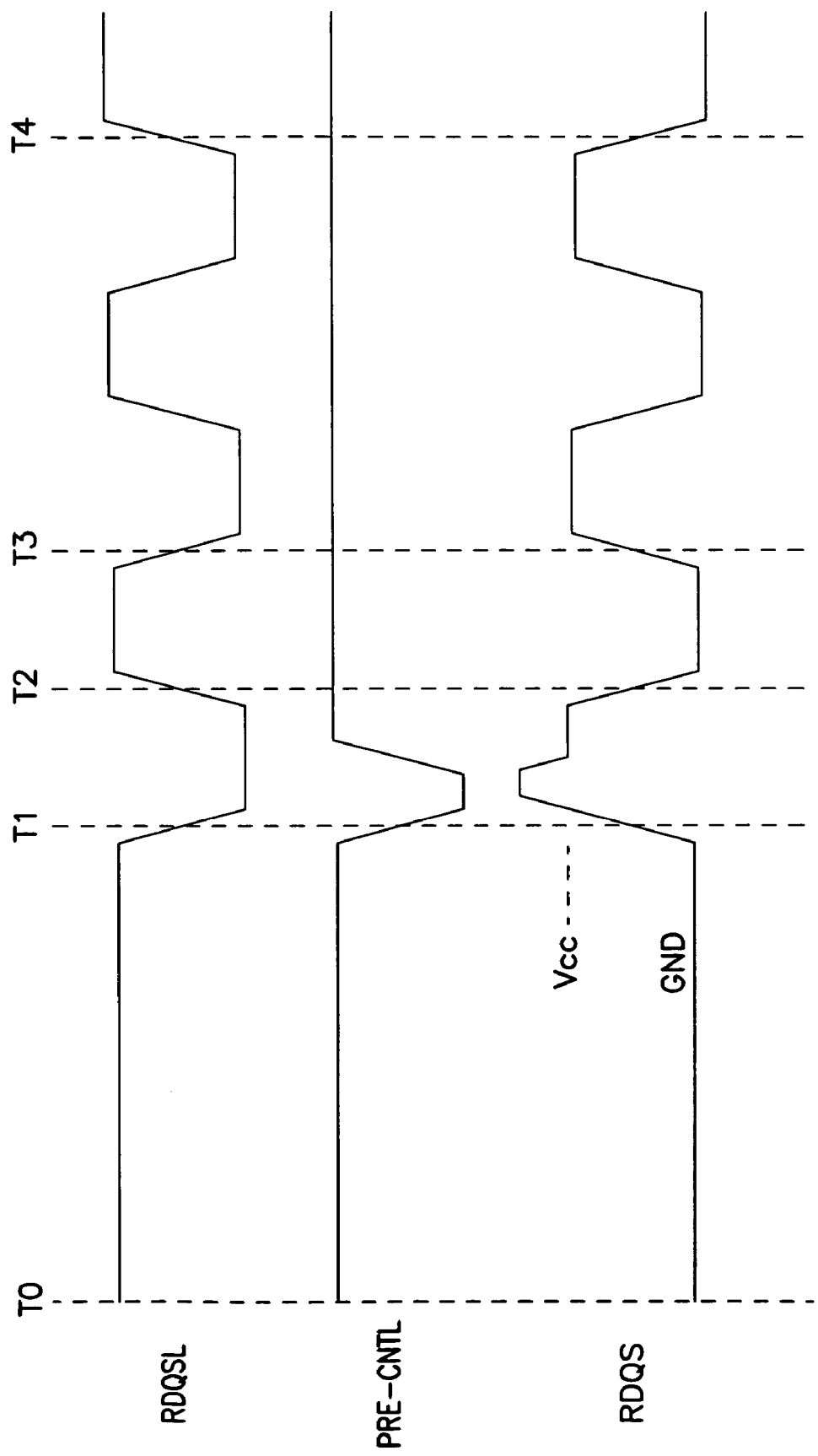
FIG. 9 is an exemplary timing diagram for FIG. 8.

FIG. 9 shows and exemplary timing diagram for FIG. 8. In FIG. 9, the RDQS signal has a termination level at ground between times T0 and T1. The PRE-CNTL signal has a low signal level when it is activated during the time interval between times T1 and T2, which is the time interval where the pre-emphasis function is performed to influence the signal level of the RDQS signal between times T1 and T2.

Figure 10:
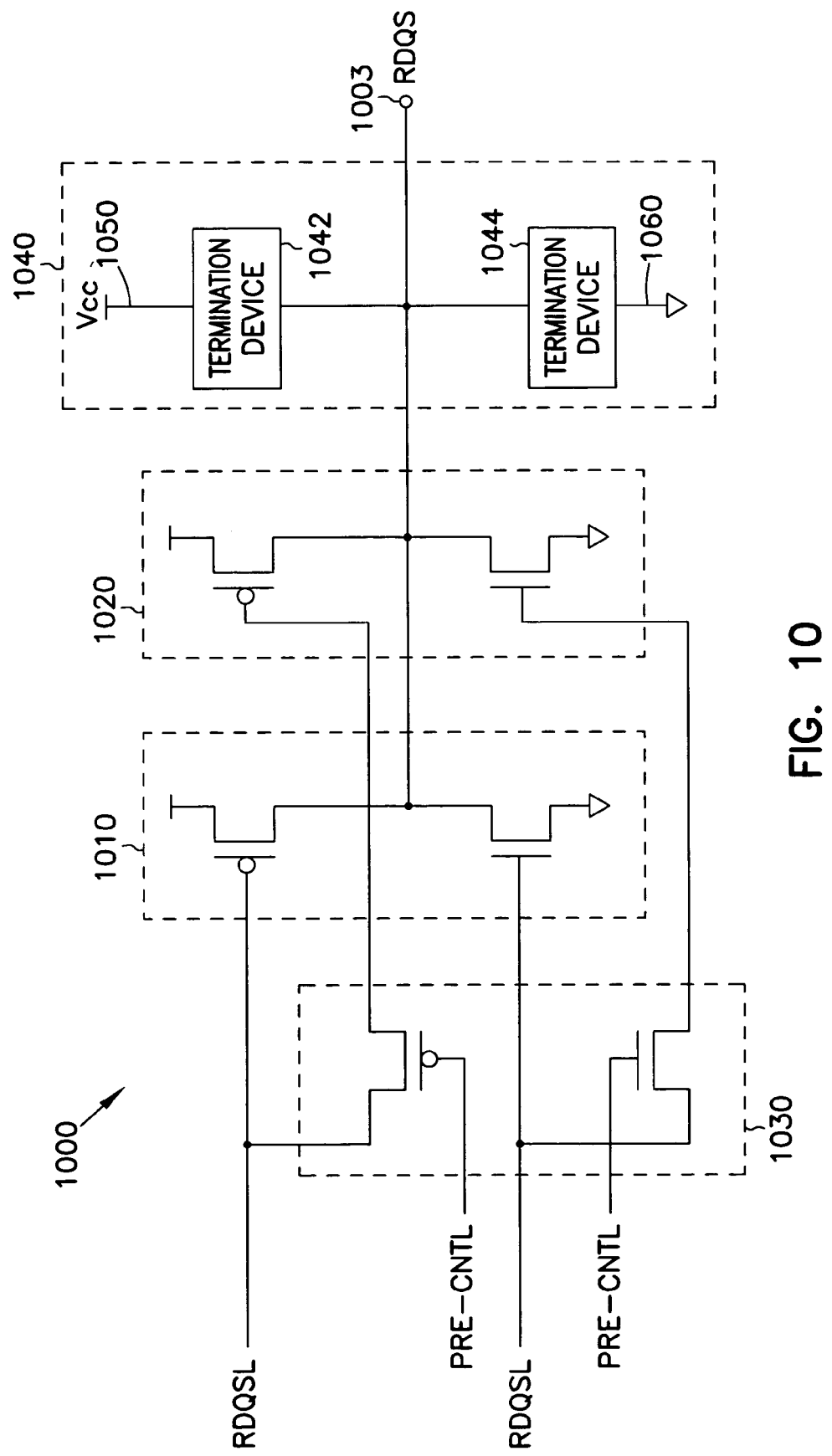
FIG. 10 shows a strobe output circuit having a termination unit connected to multiple supply nodes according to embodiments of the invention.

FIG. 10 shows a strobe output circuit having a termination unit connected to multiple supply nodes according to embodiments of the invention. Strobe output circuit 1000 includes an output driver 1010, a pre-emphasis driver 1020, a pre-emphasis driver control unit 1030, and a termination unit 1040. Strobe output circuit 1000 includes embodiments of strobe output circuits 600 and 800 of FIG. 6 and FIG. 8. In FIG. 10, termination unit 1040 includes termination devices 1042 and 1044. Termination device 1042 connects between strobe terminal 1003 and a supply node 1050. Termination device 1044 connects between strobe terminal 1003 and a supply node 1060. In some embodiments, each of the termination devices 1042 and 1044 includes a passive resistance device. In other embodiments, each of the termination devices 1042 and 1044 includes an active resistance device.

Figure 11:
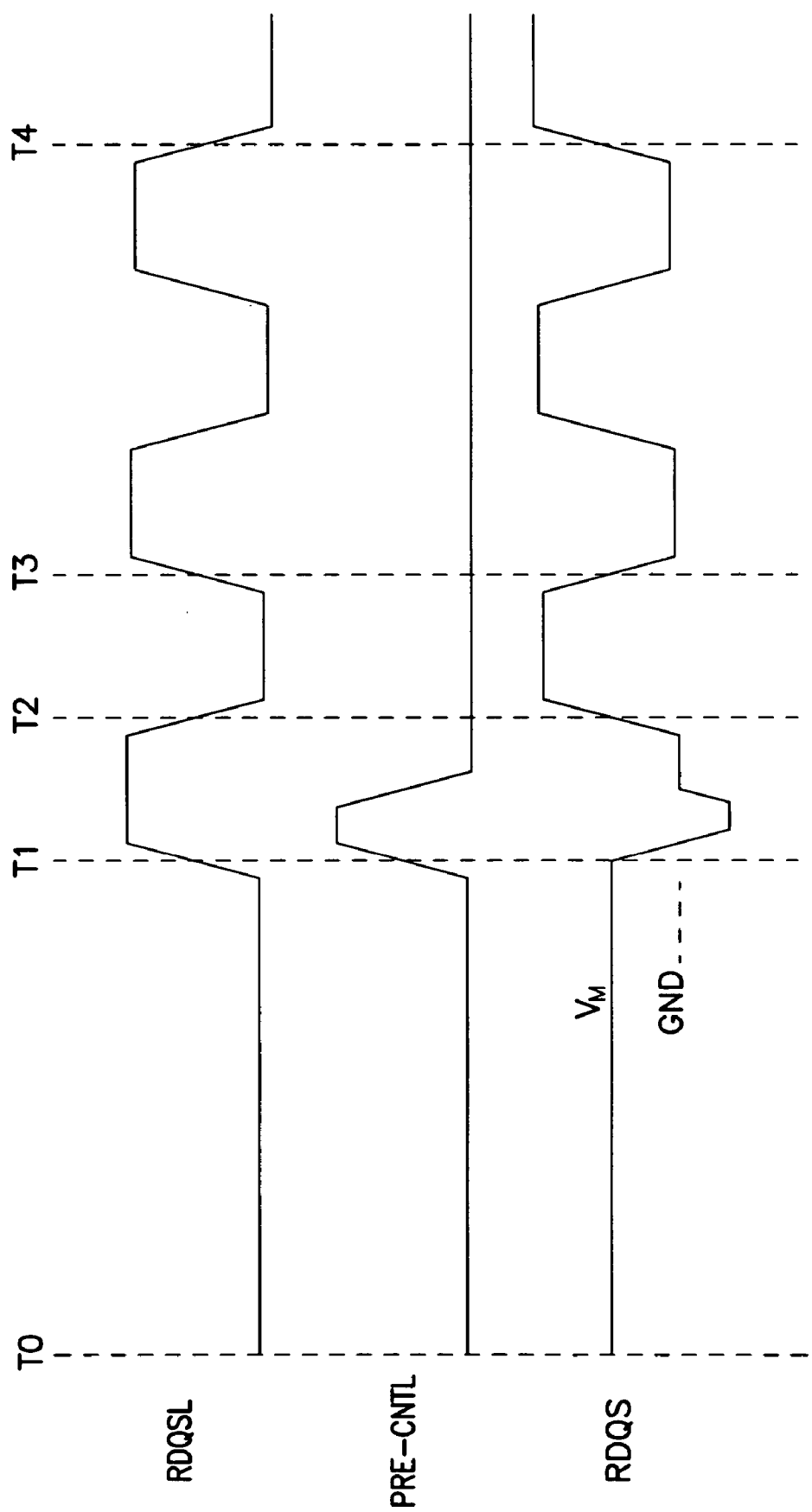
FIG. 11 is an exemplary timing diagram for FIG. 9.

FIG. 11 shows and exemplary timing diagram for FIG. 10. In FIG. 11, between times T0 and T1, the RDQS signal has a termination level at $V_M$, which is a voltage level between Vcc. The PRE-CNTL signal has a high signal level when it is activated during the time interval between times T1 and T2, which is the time interval where the pre-emphasis function is performed to influence the signal level of the RDQS signal between times T1 and T2.

Figure 12:
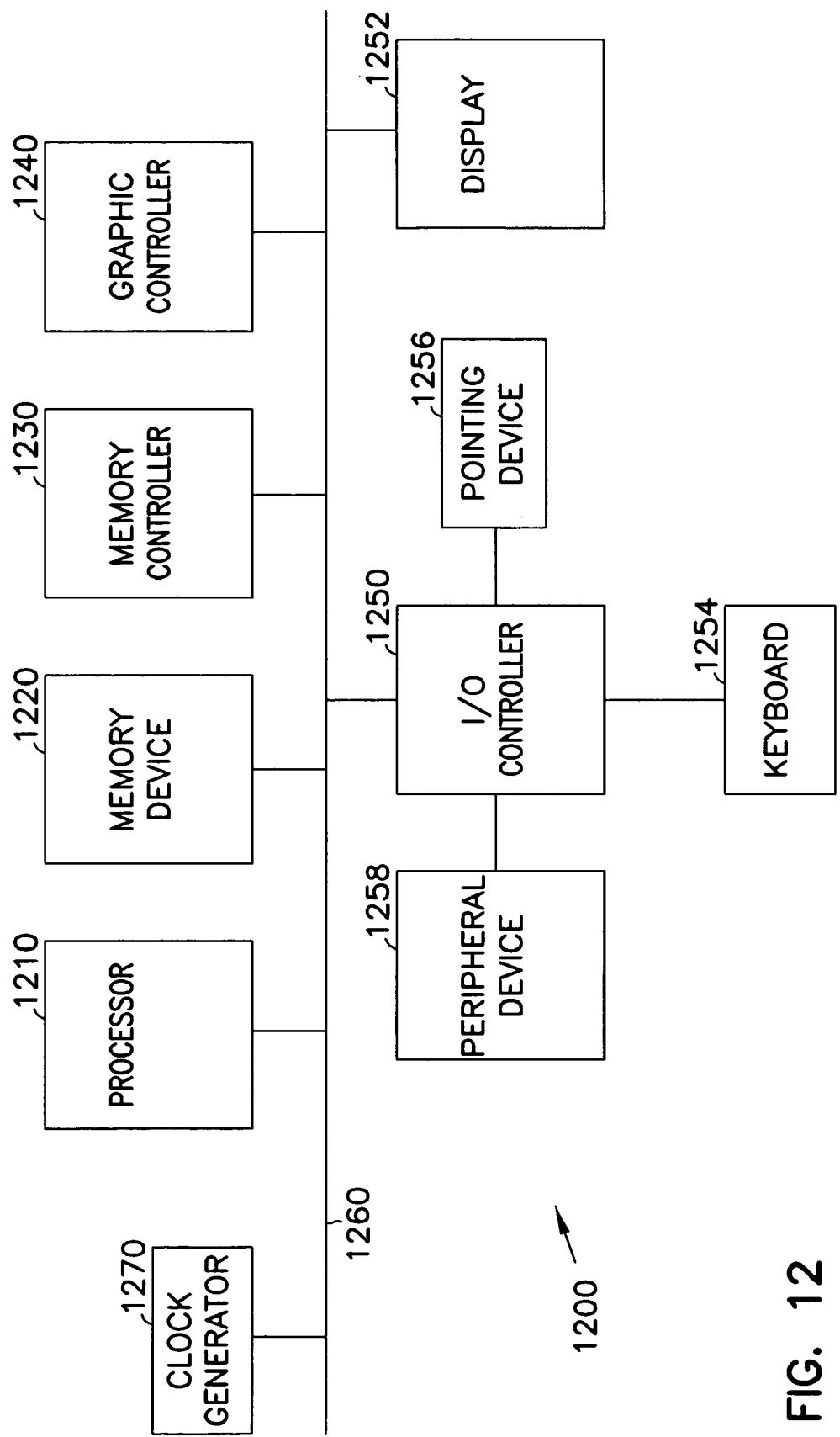
FIG. 12 shows a system according to embodiments of the invention.

FIG. 12 shows a system according to embodiments of the invention. System 1200 includes a processor 1210, a memory device 1220, a memory controller 1230, a graphic controller 1240, an input and output (I/O) controller 1250, a display 1252, a keyboard 1254, a pointing device 1256, and a peripheral device 1258. A bus 1260 connects all of these devices together. A clock generator, 1270 provides an external clock signal to at least one of the devices of system 1200. Two or more devices shown in system 1200 may be formed in a single chip. In some embodiments, system 1200 may omit one or more devices shown in FIG. 12.

Bus 1260 may be conducting traces on a circuit board or may be one or more cables. Bus 1260 may also connect the devices of system 1200 by wireless means such as electromagnetic radiation (e.g., radio waves). Peripheral device 1258 may be a printer, an optical device (e.g., a CD-ROM device or a DVD device), a magnetic device (e.g., floppy disk driver), or an audio device (e.g., a microphone). Memory device 1220 may be a dynamic random access memory (DRAM) device, a static random access memory (SRAM) device, or may be a flash memory device, or a combination thereof.

At least one of the devices shown in system 1200 includes embodiments of a pre-emphasis controller and a strobe output circuit such as pre-emphasis controller and the strobe output circuit described in FIG. 1 through FIG. 11. Thus, at least one of the devices shown in system 1200 has a pre-emphasis function such as the pre-emphasis function described in FIG. 1 through FIG. 11 to influence at least one output signal at a terminal connected to bus 1260.

System 1200 of FIG. 12 includes computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 4) players, video games, watches, etc.), and the like.

In the description of FIG. 1 through FIG. 12, portions and features in some embodiments may be included in or substituted for those of the other embodiments.

CONCLUSION

Various embodiments of the invention provide circuits and methods for improving the accuracy of signals at terminals of memory device.

As integrated circuits such as memory devices transfer data at a higher speed, signal jitter and a phenomenon such as inter-symbol interference may exist when the signals at the terminals of the memory device switch between different signal levels. Embodiments of the invention provide a technique to influence the signal level of the signals at the terminals of the memory device to reduce the signal jitter and the inter-symbol interference when the signals at the terminals of the memory device switch between different signal levels.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A memory device comprising:
   a memory array;
   a plurality of data terminals;
   a plurality of strobe terminals;
   a data transceiver circuit for transferring data between the data terminals and the memory array;
   a number of strobe output circuits, each of the strobe output circuits including a pair of parallel drivers coupled to a corresponding strobe terminal among the plurality of strobe terminals for outputting at the corresponding strobe terminal a number of strobe bits representing timing information of a number of data bits; and
   a pre-emphasis controller for providing a control signal for enabling at least one driver of the pair of parallel drivers for influencing a signal level of a selected strobe bit among the number of strobe bits at the corresponding strobe terminal.

2. The memory device of claim 1, wherein the pre-emphasis controller is configured for deactivating one driver of the pair of parallel drivers after at least one of the strobe bits is outputted at the strobe terminals.

3. The memory device of claim 1, wherein the pre-emphasis controller is configured for comparing a signal level of at least one of the strobe bits with a signal level existed at one of the strobe terminals before the strobe bits are outputted to the strobe terminals.

4. The memory device of claim 1, wherein the pre-emphasis controller is configured for influencing a signal level of only one of the strobe bits.

5. The memory device of claim 1 further comprising a number of termination units, each of the termination units being coupled to one of the strobe terminals, wherein each of the termination units is configured for applying a fixed signal level to one of the strobe terminals.

6. The memory device of claim 1, wherein a first driver of the pair of drivers includes a driver transistor having a drain coupled to the corresponding strobe terminal, a source coupled to a supply node, and a gate coupled to a first input node.

7. The memory device of claim 6, wherein a second driver of the pair of drivers includes a pre-emphasis transistor having a drain coupled to the corresponding strobe terminal, a source coupled to the supply node, and a gate coupled a second input node.

8. A memory device comprising:
   a memory array;
   a plurality of data terminals;
   a plurality of strobe terminals;
   a data transceiver circuit for transferring data between the data terminals and the memory array;
   a number of strobe output circuits, each of the strobe output circuits including a pair of parallel drivers coupled to a corresponding strobe terminal among the plurality of strobe terminals for outputting a number of strobe bits representing timing information of a number of data bits, wherein a first driver of the pair of drivers includes a driver transistor having a drain coupled to the corresponding strobe terminal, a source coupled to a supply node, and a gate coupled to an input node, and wherein a second driver of the pair of drivers includes a pre-emphasis transistor having a drain coupled to the corresponding strobe terminal, a source coupled to the supply node, and a gate coupled to a second input node; and
   a pre-emphasis controller for influencing a signal level of a selected strobe bit among the number of strobe bits, wherein the pre-emphasis controller includes a switch coupled between the first and second input nodes, the switch including a control node responsive to the pre-emphasis controller.

9. The memory device of claim 8, wherein each of the output strobe circuits further includes:

a second driver transistor having a drain coupled to the corresponding strobe terminal, a source coupled to a second supply node, and a gate coupled to a third input node; and a second pre-emphasis transistor having a drain coupled to the corresponding strobe terminal, a source coupled to the second supply node, and a gate coupled to the fourth input node.

10. A memory device comprising:
a memory array;
a number of data terminals;
a number of strobe terminals;
a data transceiver circuit coupled to the memory array and the data terminals for transferring a first data bit at a first time interval and a number of subsequent data bits after the first time interval; and
a number of strobe output circuits for transferring a number of strobe bits representing timing information of the first data bits and the subsequent data bits, each of the strobe output circuits including a first driver coupled to a corresponding strobe terminal among the plurality of strobe terminals and a second driver parallel with the first driver, wherein the first driver is configured for providing a first strobe bit at the first time interval and a number of subsequent strobe bits after the first time interval, and wherein the second driver is configured for influencing a signal representing the first strobe bit.

11. The memory device of claim 10, wherein the second driver is configured to be deactivated after the first strobe bit is provided to the corresponding strobe terminal.

12. The memory device of claim 11, wherein the first driver includes a driver transistor having a drain coupled to the corresponding strobe terminal, a source coupled to a supply node, and a gate coupled to an input node.

13. The memory device of claim 12, wherein the second driver includes a pre-emphasis transistor having a drain coupled to the corresponding strobe terminal, a source coupled to the supply node, and a gate coupled to a second input node.

14. The memory device of claim 13, wherein:
the first driver further includes a second driver transistor having a drain coupled to the corresponding strobe terminal, a source coupled to a second supply node, and a gate coupled to a third input node; and
the second driver further includes a second pre-emphasis transistor having a drain coupled to the corresponding strobe terminal, a source coupled to the second supply node, and a gate coupled to the fourth input node.

15. The memory device of claim 14 further comprising a number of termination units, each of the termination units being coupled to one of the strobe terminals, wherein each of the termination units is configured for applying a fixed signal level to one of the strobe terminals.

16. A memory device comprising:
a memory array;
a plurality of data terminals;
a plurality of strobe terminals;
a data transceiver circuit for transferring data between the data terminals and the memory array;
a data transceiver circuit for transferring data between the data terminals and the memory array; and
a number of strobe output circuits for providing timing information of the data transferred at the data terminals, wherein each of the strobe output circuits includes a pair of parallel transistors coupled between a supply node and a corresponding strobe terminal among the strobe terminals, a control transistor having a gate coupled to a control node, a source coupled to a gate of a first transistor of the pair of parallel transistors, and a drain coupled to a gate of a second transistor of the pair of parallel transistors.

17. The memory device of claim 16, wherein each of the strobe output circuits further includes a termination device coupled to the corresponding strobe terminal.

18. The memory device of claim 17, wherein the termination unit is configured for applying a fixed voltage to the corresponding strobe terminal when the first and second drivers are inactive.

19. The memory device of claim 17, wherein each of the strobe output circuits further includes a second pair of parallel transistors coupled between the second supply node and the corresponding strobe terminal, and a second control transistor having a gate coupled to the control node, a source coupled to a gate of a first transistor of the second pair of parallel transistors, and a drain coupled to a gate of a second transistor of the second pair of parallel transistors.

20. The memory device of claim 19, wherein the termination unit includes:
a first termination device coupled between the corresponding strobe terminal and the first supply node; and
a second termination device coupled between the corresponding strobe terminal and the second supply node.

21. The memory device of claim 20, wherein the one of the first and second supply nodes couples to one of a ground path of the memory device and a supply voltage path of the memory device.

22. The circuit of claim 21, wherein the first and second termination devices are configured for applying a fixed voltage to the corresponding strobe terminal when the first and second drivers are inactive.

23. A system comprising:
a processor; and
a memory device coupled to the processor, the memory device including:
    a memory array;
    a plurality of data terminals;
    a plurality of strobe terminals;
    a data transceiver circuit for transferring data between the data terminals and the memory array;
    a number of strobe output circuits, each of the strobe output circuits including a pair of parallel transistors coupled to a supply node and a corresponding strobe terminal among the plurality of strobe terminals for outputting a number of strobe bits representing timing information of a number of data bits; and
    a pre-emphasis controller for providing a control signal for enabling at least one driver of the pair of parallel drivers for influencing a signal level of a selected strobe bit among the number of strobe bits.

24. The system of claim 23, wherein the pre-emphasis controller is configured for deactivating one transistor of the pair of parallel transistors after at least one of the strobe bits is outputted at the strobe terminals.

25. The system of claim 24, wherein the pre-emphasis controller is configured for comparing a signal level of at least one of the strobe bits with a signal level existed at one of the strobe terminals before the strobe bits are outputted.

26. The system of claim 25, wherein the memory device further comprises a number of termination units, each of the termination units being coupled to one of the strobe terminals, wherein each of the termination units is configured for applying a fixed signal level to one of the strobe terminals.

27. The system of claim 26, wherein each of the strobe output circuits further includes a second pair of parallel transistors coupled to a second supply node and the corresponding strobe terminal.

28. A method comprising:
transferring a number of data bits to a number of data terminals;
transferring a number of strobe bits to a number of strobe terminals in which the strobe bits represent timing information of the data bits; and
initiating a pre-emphasis function for providing a control signal for controlling a current path among multiple current paths through one of the strobe terminals to modify a signal level of a selected strobe bit among the number of strobe bits; and
terminating the pre-emphasis function after the signal level of the selected strobe bit is modified.

29. The method of claim 28, wherein strobe terminals have a fixed signal level before the strobe bits are transferred to the strobe terminals.

30. The method of claim 29, wherein the selected bit has a signal level unequal to the fixed signal level.

31. A method comprising: transferring a number of data bits to a number of data terminals; transferring a number of strobe bits to a number of strobe terminals in which the strobe bits represent timing information of the data bits, wherein strobe terminals have a fixed signal level before the strobe bits are transferred to the strobe terminals; initiating a pre-emphasis function to modify a signal level of a selected strobe bit among the number of strobe bits, wherein the selected bit has a signal level unequal to the fixed signal level, and wherein initiating includes creating multiple current paths between each of the strobe terminals and a supply node; and terminating the pre-emphasis function after the signal level of the selected strobe bit is modified.

32. The method of claim 31, wherein terminating includes disabling one of the multiple current paths.

33. The method of claim 32, wherein transferring the number of strobe bits includes comparing the signal level the selected strobe bit with a signal level existed at one of the strobe terminals before the selected strobe bit is outputted.

34. The method of claim 33 further includes storing the signal level existed at one of the strobe terminals before the selected strobe bit is outputted to one of the strobe terminals.

35. A method comprising:
transferring a first data bit and a number of subsequent data bits to a data terminal;
transferring a first strobe bit to a strobe terminal in which the first strobe bit represents timing information of the first data bit;
transferring a number of subsequent strobe bits to the strobe terminal in which the subsequent strobe bits represent timing information of the subsequent data bits; and initiating a pre-emphasis function for providing a control signal to control a current path among multiple current paths through the strobe terminal for modifying a signal level of the first strobe bit during a pre-emphasis function.

36. The method of claim 35 further comprising:
ending the pre-emphasis function after the signal level of the first strobe bit is modified.

37. The method of claim 36, wherein transferring the first data bit and the first strobe bit occurs in a first time interval, and wherein transferring the subsequent data bits and the subsequent strobe bits occurs in a second time interval after the first time interval.

38. A method comprising: transferring a first data bit and a number of subsequent data bits to a data terminal; transferring a first strobe bit to a strobe terminal in which the first strobe bit represents timing information of the first data bit; transferring a number of subsequent strobe bits to the strobe terminal in which the subsequent strobe bits represent timing information of the subsequent data bits, wherein transferring the first data bit and the first strobe bit occurs in a first time interval, and wherein transferring the subsequent data bits and the subsequent strobe bits occurs in a second time interval after the first time interval; and modifying a signal level of the first strobe bit during a pre-emphasis function, wherein modifying includes generating multiple parallel current paths between the strobe terminal and a supply node during the first time interval; and ending the pre-emphasis function after the signal level of the first strobe bit is modified.

39. The method of claim 38, wherein modifying further includes disabling one of the multiple parallel current paths during the second time interval.

40. The method of claim 39, wherein transferring the first data bit includes transferring the first data bit having a signal level unequal to a signal level of the strobe terminal before the first time interval.

41. The method of claim 40, wherein the signal level of the strobe terminal before the first time interval is a fixed signal level.

42. The method of claim 41, wherein the first time interval occurs after a latency time interval, wherein the latency time interval occurs between an issuance of a command signal and the availability of the first data bit at the data terminal.

* * * * *